(12) United States Patent
Struble et al.

(10) Patent No.: US 7,030,515 B2
(45) Date of Patent: Apr. 18, 2006

(54) INDIVIDUALLY BIASED TRANSISTOR HIGH FREQUENCY SWITCH

(75) Inventors: Wayne Struble, Franklin, MA (US); Norbert A. Schmitz, Salem, NH (US)

(73) Assignee: M/A-COM, Inc., Lowell, MA (US)

( * ) Notice: Subject to any disclaimer, the term of this patent is extended or adjusted under 35 U.S.C. 154(b) by 384 days.

(21) Appl. No.: 10/442,764

(22) Filed: May 21, 2003

(65) Prior Publication Data

US 2004/0235549 A1 Nov. 25, 2004

(51) Int. Cl.
*H01L 29/08* (2006.01)
(52) U.S. Cl. ...................... 307/128; 307/139
(58) Field of Classification Search ............... 307/139, 307/128
See application file for complete search history.

(56) References Cited

U.S. PATENT DOCUMENTS

| | | | |
|---|---|---|---|
| 3,609,406 A * | 9/1971 | Walther | ............ 326/88 |
| 4,686,380 A * | 8/1987 | Angott | ............ 307/125 |
| 4,808,859 A | 2/1989 | Even-or et al. | |
| 5,023,494 A | 6/1991 | Tsukii et al. | |
| 5,061,911 A | 10/1991 | Weidman et al. | |
| 6,426,525 B1 | 7/2002 | Brindle | |
| 6,690,250 B1 * | 2/2004 | M.o slashed.ller | ............ 333/181 |
| 2004/0235549 A1 * | 11/2004 | Struble et al. | ............ 463/16 |

* cited by examiner

*Primary Examiner*—Lynn Feild
*Assistant Examiner*—Michael Rutland-Wallis

(57) ABSTRACT

A single-pole multiple-throw RF switch includes first and second FET arrangements, each having a gate and a controlled current path (CCP). One end of the CCP of each FET is connected to a common port by way of an arrangement which blocks DC flow between the FETs, but allows RF flow. Bias is applied to the gates of the FETs to enable RF flow through the CCP of a selected one and not through the others. One version uses a single bias source and cross-coupled resistors, and another version uses plural bias sources switched to the various FETs.

14 Claims, 8 Drawing Sheets

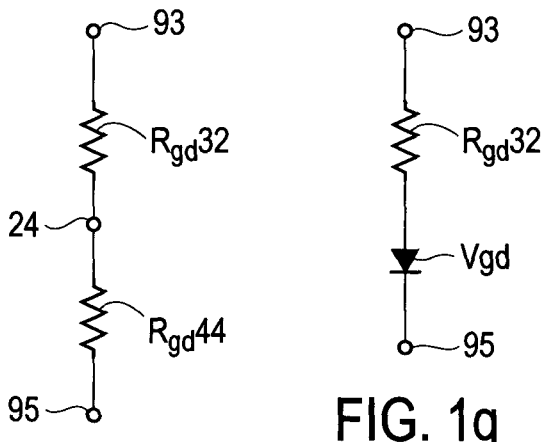
FIG. 1f
PRIOR ART
FIG. 1g
PRIOR ART
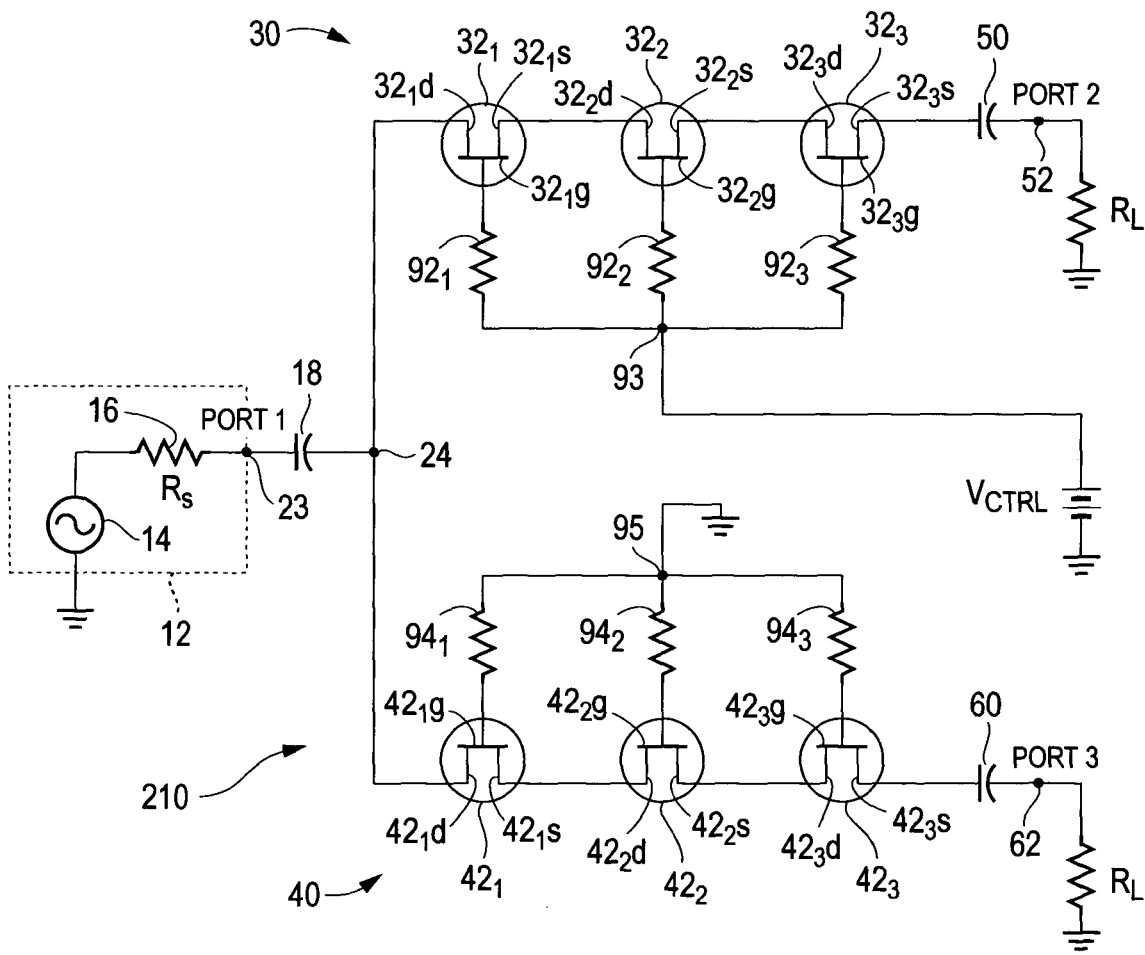
FIG. 2 PRIOR ART

US 7,030,515 B2

INDIVIDUALLY BIASED TRANSISTOR HIGH FREQUENCY SWITCH

FIELD OF THE INVENTION

This invention relates to switches for use at high frequencies, and more particularly to such switches which use Field Effect Transistors (FETs).

BACKGROUND OF THE INVENTION

Field Effect Transistor (FET) high frequency switches are well known in the field of signal transmission. High power high frequency (e.g., radio frequency (RF)) switches using transistor technology are extremely desirable due to their low DC power consumption as compared to traditional PIN diode switches.

FIG. 1a is a simplified diagram, partially in block and partially in schematic form, illustrating a prior-art single-pole double-throw (SPDT) high-frequency or radio-frequency switch 10. It is useful to note that the term "radio frequency" has a broad meaning, and encompasses essentially any frequency of alternating signal. In the past, the term "radio-frequency" related to the then-known frequencies which could be used to propagate radio waves, generally in the frequency range of a few kilohertz (KHz) to 1600 megahertz (MHz). Subsequent improvements in technology have made the upper limit of the term difficult to define, but the term may even include the frequencies of light waves. However, the meaning of RF does not include direct current (that is, signal having zero frequency). FIG. 1b illustrates a conventional mechanical switch symbol 8 the single-pole double-throw function of switch 10 of FIG. 1a. In FIG. 1b, a single movable "pole" 10M is hinged about an axis 11M for motion between two positions, the illustrated one of which causes throw 10M to be in contact with, and therefore make electrical connection to, independent, individual or separate "port" 62 and not to individual "port" 52, and the non-illustrated one of which results in connection of throw 10M to common "port" 52 and not to port 62. Thus, the single pole 10M can be set to one of two different "throw" positions, one of which connects common port 23 to individual port 52 and not to 62, and the other of which connects common port 23 to individual port 62, and not to 52.

In FIG. 1a, signal to be propagated is produced by a signal source designated generally as 12, which is illustrated as including a conventional voltage source 14 and series resistance or impedance 16. The signal produced by source 12 is intended to be selectively coupled to one of "load" resistances 20 and 22 by way of switch 10. Those skilled in the art know that the values of load resistances 20 and 22, and the internal resistance 16 of source 12, should match the characteristic or "surge" impedance of the transmission lines through which signals flow. The characteristic impedance of ordinary transmission lines as used for RF signal propagation ranges from about 50 ohms to about 300 ohms, but specialized transmission lines may have impedances as low as about ten ohms and higher than 300 ohms.

Signal from source 12 of FIG. 1a is applied by way of switch common node 23, a direct current (DC) blocking capacitor 18 and a node 24 to field-effect transistor (FET) arrangements designated as 30 and 40. FET arrangement 30 is illustrated as including a single FET 32, including source, drain and gate electrodes 32s, 32d, and 32g, respectively. Similarly, FET arrangement 40 is illustrated as including a single FET 42, including source, drain and gate electrodes 42s, 42d, and 42g, respectively. The symbol used to illustrate a FET, such as FET 32, is intended to include any type of FET, and specifically to include both enhancement- and depletion-mode FETs. The source terminal 32s of FET 32 is connected by way of a DC blocking capacitor 50 and an individual node 52 to load resistance 20. Similarly, source terminal 42s of FET 42 is connected by way of a DC blocking capacitor 60 and an individual node 62 to load resistance 22.

Those skilled in the art know that a field-effect transistor includes a controllable path or "channel" extending from the source electrode (source) to the drain electrode (drain), in which the voltage between the gate electrode (gate) and the conductive path or channel controls the conduction of the path or channel. FIG. 1c is a simplified conceptual representation of FET 32 of FIG. 1a. In FIG. 1c, the conductive "channel" of the FET is illustrated as an elongated region 70 extending from the source 32s to the drain 32d. The conduction of channel 70 is controlled by the electric field established between the conductive gate electrode 72 and the conductive channel 70. As mentioned, the conduction of the conductive channel extending between the source 32s and the drain 32d is controlled by the bias voltage applied between the gate 32g and the conductive channel 70. Since the channel 70 is conductive to a greater or lesser degree under many operating conditions, the control voltage may be applied between (in the electrical sense, rather than mechanical or positional sense, of the word "between") the conductive gate structure 72 and either the source 32s or drain 32d. In FIG. 1a, the controllable conductive paths or channels of transistors 32 and 42 are designated 32p and 42p, respectively.

All conductors, and especially semiconductors, include inherent resistance. Thus, the conductive channel 70 of FIG. 1a may be represented by a resistance extending between the source 32s and the drain 32d. Such a resistance is illustrated as 70' in FIG. 1d. The value of resistance 70 will depend upon the biasing of the gate-to-path or -channel region, being relatively small when the FET is ON or conductive, and relatively large when the FET is OFF or nonconductive. In this context, "small" and "large" are relative to the characteristic impedance of the transmission lines through which the RF signal flows, which is typically 50 or 75 ohms. Consequently, a path resistance of, say, 450 ohms in a 50-ohm system or 675 ohms in a 75-ohm system would be "large," in that such a resistance would result in 20 decibels (dB) of attenuation, while a path resistance of, say, three (3) ohms in a 50-ohm system or 4½ ohms in a 75 ohm system would be "small," in that the resulting attenuation would be about 0.5 dB.

In FIG. 1a, gate 32g of FET 32 is connected by way of a series resistance 92 to a node 93, and gate 42g of FET 42 is connected by way of a series resistance 94 to a node 95. Resistances 92 and 94 may be provided in the form of discrete resistors, or in any suitable other form. Generally, such resistors have a relatively large resistance, on the order of 1000 ohms or more, so as to limit gate current in the event of a momentary short-circuit or arc. However, such resistances are small by comparison with the input resistance or impedance of the gate electrode, and large by comparison with the characteristic impedance of the transmission lines of the system.

In FIG. 1a, a control voltage or bias voltage (bias) arrangement designated generally as 80 includes a source of direct voltage 82 illustrated by a battery symbol. Source 82 has a positive (+) terminal and a negative (−) terminal. The terminals of source 82 are coupled by way of a switch illustrated as a mechanical double-pole double-throw (DPDT) switch 84 to the gate terminals 32g and 42g of FETs 32 and 42. Those skilled in the art know that such mechanical representations are merely for the purpose of explanation, and that electronic switches are ordinarily used. The operation of DPDT switch 84 is straightforward, and merely has the effect of applying the positive voltage of source 82 to node 93 and the negative voltage to node 95 in one position of the switch, and of applying the negative voltage to node 93 and the positive voltage to node 95 in the other position of the switch. In effect, the operation of switch 84 merely connects the "battery" or source 82 to nodes 93 or 95 with mutually reversed polarities.

When the position of switch 84 of FIG. 1a is as illustrated, the positive terminal of source 82 is connected to node 93 and the negative terminal is connected to node 95, and in the other position of switch 84, the positive terminal of source 82 is connected to node 95 and the negative terminal is connected to node 93. In general, the conduction of the conductive path of a FET can be controlled with either a relatively positive or relatively negative voltage on the gate electrode, depending upon the design and doping of the channel, which is to say that it can operate in either an "enhancement" or "depletion" mode. A junction FET must be operated with the gate junction reverse-biased to maintain the high gate impedance. Forward bias of the gate junction in a junction FET at least lowers the gate impedance and decreases the voltage between the gate electrode and the conductive channel to one semiconductor junction offset voltage, generally referred to as Vg.

FIG. 1e is a simplified representation of those portions of the arrangement of FIG. 1a which are relevant to an analysis of the biasing of the FETs therein. Elements of FIG. 1e corresponding to those of FIG. 1a are designated by like reference numerals. In FIG. 1e, there is a direct-current conduction path extending from node 93 to node 95. The path includes, in order beginning from node 93, the resistance 92, the gate resistance or impedance of transistor 32, the resistance of the conductive path extending through node 24, the gate resistance or impedance of transistor 42, and the resistance of resistor 94. In this path, the resistance of the conductors extending through node 24 are very low. The resistances of resistors 92 and 94 are large, but do not control current flow in the gate circuit, because the gate resistance of at least one or the other of the FETs 32 or 34 is very high, and establishes the bias current flow from node 93 to node 95 regardless of the presence of resistances 92 and 95. Both FETs 32 and 42 will exhibit very large impedances, regardless of the polarization of the gate bias voltage. In the case of JFETs, only that one of the gate-to-conductive paths which is reverse biased will have a very high resistance, while the other gate will be forward-biased and have a very low resistance. The gate-to-drain or gate-to-path resistances are so great that the presence of gate resistances 93 or 95 make no difference to the gate current or the gate-to-drain voltage. Thus, the gate resistances such as 93 and 95 may be ignored for purposes of analysis.

In one case, the two high resistances may be connected in series, as represented by gate-to-drain resistances $R_{gd}32$ and $R_{gd}42$ in FIG. 1f. In such a series connection, the voltage drops across the gate-to-conductive-paths of the two FETs will be inversely related to their resistances. If they have the same gate resistances, the applied bias voltage will be divided equally between the two gate-to-drain resistances of the transistors, so that the voltage at node 24 of FIG. 1f will be ½ of the total voltage across control voltage terminals 93 and 95. If the gate-to-drain resistances $R_{gd}32$ and $R_{gd}42$ happen to be dissimilar, the bias voltage distribution across the two resistances will be unequal, and the voltage at node 24 will not be ½ the applied voltage, but some other ratio.

In the case of JFETs, one of the two FETs which is reverse biased will have a large resistance or impedance, and the other will have less than one volt of bias. This is illustrated in FIG. 1g, in which the series connection includes $R_{gd}32$, representing the large impedance of the reverse-biased semiconductor junction of FET 32, while the forward-biased gate-to-drain junction of FET 42 is represented by a diode symbol designated Vgd. Thus, in the case of JFETs the total bias voltage available at terminal 93, minus one Vgd, will appear across the reverse-biased gate-to-drain junction of that FETs which has a reverse-biased gate junction.

In the arrangement of FIG. 1a, the bias applied to the pair of FETs 32 and 42 is such as to render the controllable conductive path of one of the transistors conductive, and the other nonconductive. That one of the controllable paths 32p, 42p which is rendered conductive by application of appropriate gate bias becomes conductive, and responsive to the applied RF signal, while the other one of the controllable paths is rendered nonconductive, and nominally nonresponsive to the applied RF. The one controllable conductive path which is controlled to conduction may be termed ON, and the one which is controlled to nonconduction may be termed OFF. In use, the ON transistor conducts the RF signal between its individual port and the common port, and the OFF transistor provides little, and ideally no conduction, between its individual port and the common port. Thus, if RF signal is applied from source 12 to node 23, and transistor 32 is ON and transistor 42 is OFF, RF signal will be coupled to load resistor 20 at port 52 with little loss (so long as the resistance of the conductive path is small compared with the source resistance 16 and the load resistance 20 or 22). The path from node 23 to load resistor 22 at individual port or node 62 will be quite lossy, because transistor 42 is OFF, meaning that its conductive channel has a large resistance. In this state, the SPDT switch 10 may be said to be in a state that couples the signal preferentially to individual port or node 52, and not to port or node 62. Similarly, if RF signal is applied from source 12 to node 23, transistor 42 is ON and transistor 32 is OFF, RF signal will be coupled to load resistor 22 at port 62 with little loss, while the path from node 23 to load resistor 20 at individual port or node 52 will be quite lossy. In this state, the SPDT switch 10 may be said to be in a state that couples the signal preferentially to individual port or node 62, and not to port or node 52. It should be understood that the switch 10 can operate for RF conduction in the opposite direction, namely from individual port or node 52 to common port or node 23 (in one state of switch 10) or from individual port or node 62 to common node 23 (in the other state of switch 10).

It will be clear that during operation of RF switch 10 of FIG. 1a, there is a significant bias-related voltage at junction 24, and this bias voltage will, in general, be coupled through the path 32p, 42p of that one of the FET transistors 32, 42 which happens to be rendered conductive to the source terminal 32s, 42s of that FET. Capacitors 50 and 60 prevent application to the load resistances 20, 22 of this component of the direct bias voltage. This decoupling prevents changes in the bias applied to the RF switch 10 which might be attributable to the presence or absence of a load resistor at the independent, individual or separate ports of the switch, or to the use of load resistances which are of other than the design value.

FIG. 2 is a simplified diagram in block and schematic form of a SPDT RF switch 210, which is generally similar to switch 10 of FIG. 1a. In FIG. 2, each FET arrangement 30, 40 of FIG. 1a includes plural FETs arranged with their controlled current conducting paths in cascade. More particularly, in FIG. 2, FET arrangement 30 includes FETs $32_1$, $32_2$, and $32_3$. The drain $32_3d$ of FET $32_3$ is connected to the source $32_2s$ of transistor $32_2$, and the drain $32_2d$ of transistor $32_2$ is connected to the source $32_1s$ of transistor $32_1$. Thus, the conductive paths of the three transistors $32_1$, $32_2$, and $32_3$ are connected in series. In effect, the three transistors $32i$, $32_2$, and $32_3$ have been "combined" to form a composite transistor corresponding to transistor arrangement 30, having as a source the source $32_3s$ of transistor $32_3$, as a drain the drain $32_1d$ of transistor $32_1$, and having a plurality of gates, namely gates $32_1g$, $32_2g$, and $32_3g$ spaced along the composite controlled conductive path. As illustrated in FIG. 2, the gates $32_1g$, $32_2g$, and $32_3g$ are connected in common to bias node 93 by way of individual resistors $92_1$, $92_2$, and $92_3$, for common biasing of the gates to the composite conductive path. Similarly, FET arrangement 40 includes FETs $42_1$, $42_2$, and $42_3$. The drain $42_3g$ of FET $42_3$ is connected to the source $42_2s$ of transistor $42_2$, and the drain $42_2d$ of transistor $42_2$ is connected to the source $42_1s$ of transistor $42_1$. Thus, the conductive paths of the three transistors $42_1$, $42_2$, and $42_3$ are connected in series. In effect, the three transistors $42_1$, $42_2$, and $42_3$ have been "combined" to form a composite transistor corresponding to transistor arrangement 40, having as a source the source $42_3s$ of transistor $42_3$, as a drain the drain $42_1d$ of transistor $42_1$, and having a plurality of gates, namely gates $42_1g$, $42_2g$, and $42_3g$ spaced along the composite controlled conductive path.

As illustrated in FIG. 2, the gates $42_1g$, $42_2g$, and $42_3g$ are connected in common to bias node 95 by way of individual resistors $94_1$, $94_2$, and $94_3$, for common biasing of the gates to the composite conductive path. The multitransistor control arrangement of FIG. 2 by comparison with the single-transistor control of FIG. 1a provides the advantage of greater isolation between common port 23 and that individual port associated with the OFF path. It has the disadvantage that the loss in the ON path is greater than in the arrangement of FIG. 1a. In general, the use of a single transistor for each side of the RF switch has advantages and disadvantages relative to the use of plural cascaded or series transistors, but the basic principles of operation of such a switch are not dependent upon the number of cascaded transistors on each side.

Improved RF switch arrangements are desired.

SUMMARY OF THE INVENTION

A switch according to an aspect of the invention is for switching radio-frequency electromagnetic signal between a common port and first and second individual ports. The switch comprises a first FET including a signal path extending from a source terminal to a drain terminal, and also including a gate terminal. The conduction of the signal path of the first FET is under control of a gate-to-path control voltage applied thereto. A second FET includes a signal path extending from a source terminal to a drain terminal, and also includes a gate terminal. The conduction of the signal path of the second FET is under control of a gate-to-path control voltage applied thereto. Connection means are coupled to the common port, to a first terminal of the signal path of the first FET, and to a first terminal of the signal path of the second FET, for coupling alternating current, but not direct current, between the common port and the first terminals of the signal paths of the first and second FETs. First further connection means are coupled to the second terminal of the signal path of the first FET and to the first individual port, for coupling alternating signal between the second signal terminal of the first FET and the first individual port. Second further connection means are coupled to the second terminal of the signal path of the second FET and to the second individual port, for coupling alternating signal between the second signal terminal of the second FET and the second individual port. At least one controllable source of control voltage is provided. The controllable source of control voltage is coupled to the first and second FETs to bias the first FET for conduction when the second FET is biased for nonconduction, and to bias the second FET for conduction when the first FET is biased for nonconduction.

In a particular embodiment of the switch according to an aspect of the invention, the at least one controllable source of the control voltage defines first and second control voltage terminals across which the control voltage is produced. The controllable source further comprises first conductive means coupled to the first control voltage terminal of the controllable source and to the gate electrode of the first FET, and second conductive means coupled to the first control voltage terminal of the controllable source and to one of the first and second electrodes of the second FET. In addition, third conductive means are coupled to the second control voltage terminal of the controllable source and to the gate electrode of the second FET, and fourth conductive means are coupled to the second control voltage terminal of the controllable source and to one of the first and second electrodes of the first FET. In particularly advantageous embodiments, at least one of the first FET and the second FET is a composite FET including plural cascaded FET sections.

According to an embodiment, a semiconductor switch comprises an input port; at least first and second output ports; a first set of transistors having gate, source and drain terminals and coupled to the first output port at the source terminal; and a second set of transistors having gate, source and drain terminals and coupled to the second output port at the source terminal. A first capacitor is coupled between the input port and the drain terminal associated with the first set of transistors, and a second capacitor is coupled between the input port and the drain terminal associated with the second set of transistors. A first resistor is coupled between the source terminal associated with the first set of transistors and another terminal associated with a controllable voltage signal, and a second resistor is coupled between the source terminal associated with the second set of transistors and another terminal associated with a controllable voltage signal. The switch further includes a controllable source for alternately biasing the first and second sets of transistors between ON and OFF states, wherein the first resistor cooperates with the first and second capacitors to provide a DC path bypassing the gate-drain terminal voltage drop associated with the first set of transistors when the first set is biased in the ON state, and wherein the second resistor cooperates with the first and second capacitors to provide a DC path bypassing the gate-drain terminal voltage drop associated with the second set of transistors when the second set is biased in the ON state.

The input power value at which the switch will begin to distort an input signal is determined by the following equation:

$$P_{PL}=10\,\log_{10}\{125/R_s[2*N(V_{po}+V_{CTRL})(N*R_{on}+R_S+R_L/(N*R_{on}+R_L)]^2\},$$

where $V_{po}$ is the pinchoff voltage of the first set of transistors, $V_{CTRL}$ is the control voltage applied to the gates of the second set of transistors, $R_{on}$ is the combined "ON" resistance of the second set of transistors, $R_S$ is the voltage source resistance, $R_L$ is the load resistance, and N is the number of transistors in each of the first and second sets of transistors.

A method is disclosed for controlling a transistor switch comprising at least a first transistor arrangement including a signal path extending from a source terminal to a drain terminal, and also including a gate terminal, the conduction of the signal path being under control of a gate-to-path control voltage, and a second transistor arrangement including a signal path extending from a source terminal to a drain terminal, and also including a gate terminal, the conduction of the signal path being under control of a gate-to-path control voltage. The method comprises providing a first capacitor between the input port and the drain terminal associated with the first transistor arrangement, and a second capacitor between the input port and the drain terminal associated with the second transistor arrangement; providing a first resistor between the source terminal associated with the first transistor arrangement and another terminal, and a second resistor between the source terminal associated with the second transistor arrangement and another terminal; and alternately switching ON and OFF each of the first and second transistor arrangements, whereby a DC path is provided bypassing the gate-drain diode of the first transistor arrangement when said arrangement is in the ON condition, and whereby a DC path is provided bypassing the gate-drain diode of the second transistor arrangement when said arrangement is in the ON condition.

BRIEF DESCRIPTION OF THE DRAWING

FIG. 1g is a simplified schematic representation of the gate biasing arrangement of FIGS. 1a and 1d for the case of a junction FET;

FIG. 2 is a simplified diagram, in block and schematic form, of a prior art RF switch using plural FET transistor cascades on each half of the switch;

FIG. 4 illustrates a rearrangement of capacitors on the common side of the RF switch illustrated in FIG. 3a;

DETAILED DESCRIPTION OF THE INVENTION

Figure 3A:
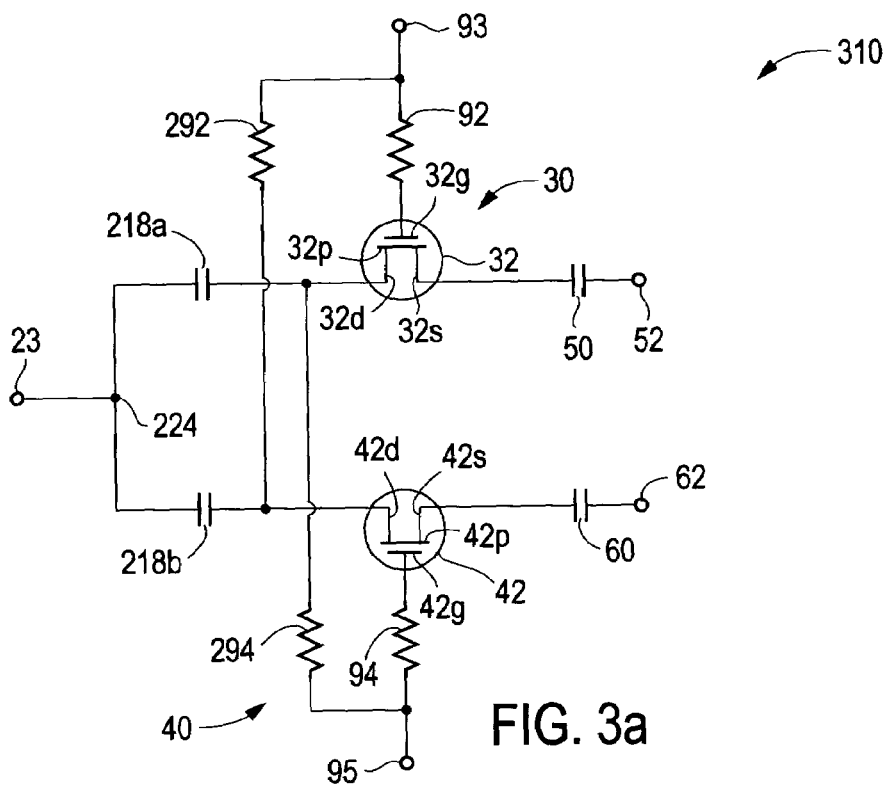
FIG. 3a is a simplified schematic diagram of an RF switch according to an aspect of the invention.

FIG. 3a is a simplified schematic diagram of an RF switch according to an aspect of the invention. In FIG. 3a, a common node 23 is for coupling to a common source or sink of alternating or RF signal. For simplicity, the description is couched in terms of propagation from common port 23 to one or the other of independent, individual, or separate ports 52 or 62, but those skilled in the art will recognize that, as to the RF signal, the circuit is reciprocal or independent of the direction of signal flow. In the case of an RF source connected to port 23, the RF or other alternating signal arrives at a node 224. From node 224, the RF signal is coupled by way of a first capacitor 218a to the drain 32d of FET 32, and by way of a second capacitor 218b to the drain 42d of FET 42. Thus, the RF signal applied to "input" port 23 becomes available at the drains of both FETS 32 and 42. This is equivalent to saying that the RF signal arrives at the drain end 32d of the signal path 32p of FET 32 and at the drain end 42d of the signal path 42p of FET 42 of FIG. 3a. The bias conditions established between the gate electrodes of the FETs and their signal paths or channels determines whether the signal propagates to their source ends.

Figure 1A:
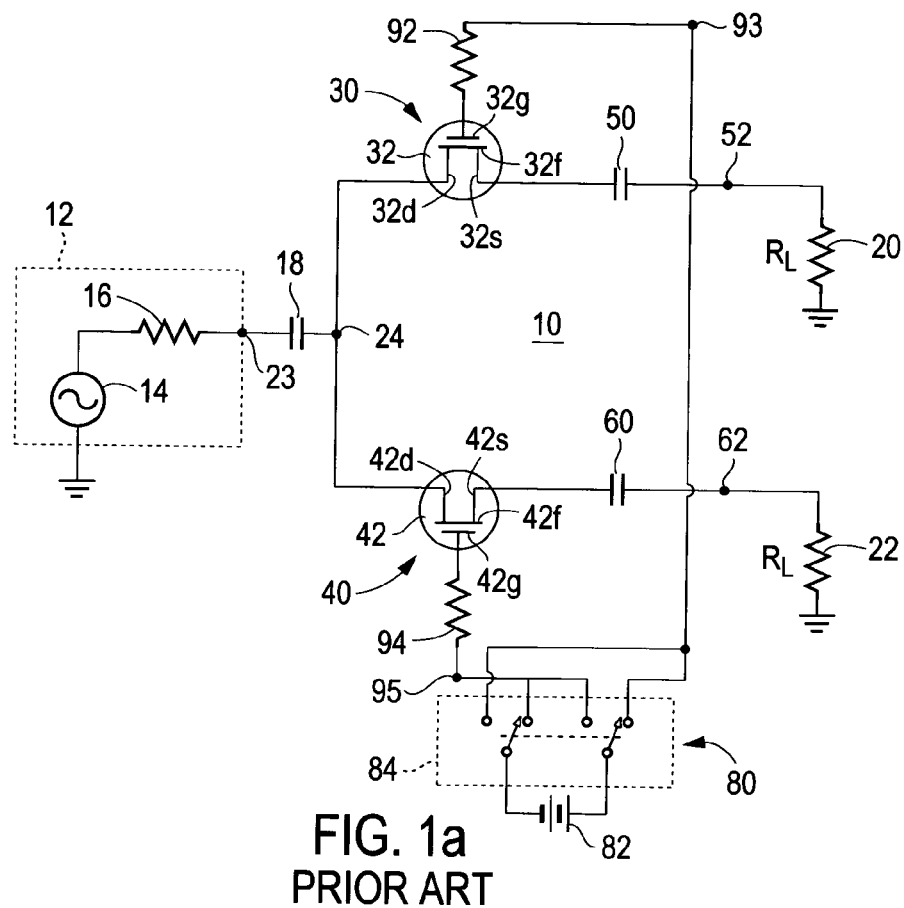
FIG. 1a is a simplified diagram, in block and schematic form, of a prior art RF switch.
Figure 1B:
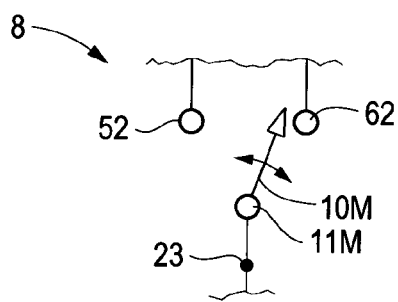
FIG. 1b is an exemplary illustration of a SPDT switch.
Figure 1C:
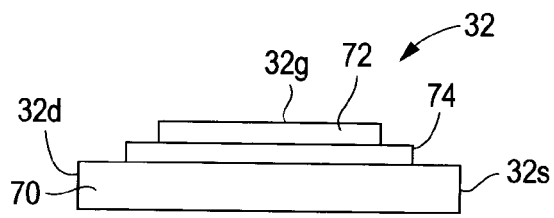
FIG. 1c is a simplified conceptual representation of a cross-section of a portion of a FET.
Figure 1D:
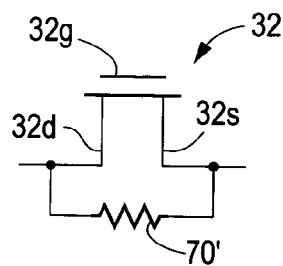
FIG. 1d is a simplified representation of the channel resistance of a FET.
Figure 1E:
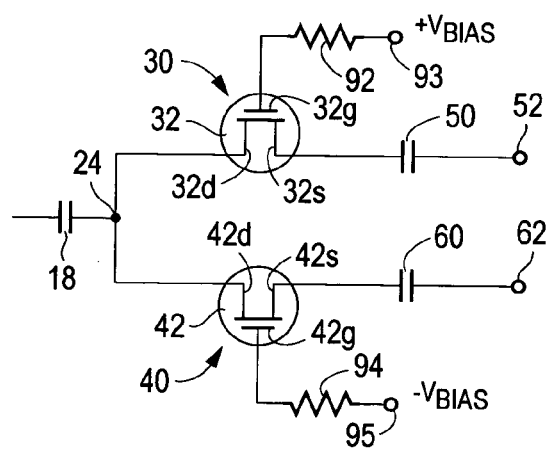
FIG. 1e is a simplified version of the diagram in block and schematic form of FIG. 1a, FIG. 1f is a simplified schematic representation of the FET gate biasing arrangement of FIGS. 1a and 1d.

The biasing arrangement of SPDT switch 310 of FIG. 3a differs from that of SPDT switches 10 or 210 of FIGS. 1a and 2, respectively. In FIG. 3a, each terminal 93, 95 to which bias voltage is applied from a control voltage source (not illustrated in FIG. 3a) has a connecting resistor 92, 94 which couples the bias to the corresponding gate electrode 32g, 42g, respectively, as in FIGS. 1a and 2. In addition, the arrangement of FIG. 3a includes a further resistor 292 connecting control bias terminal 93 to drain 42d of FET 42, and another resistor 294 connecting control bias terminal 95 to drain 32d of FET 32. The values of additional "cross-coupling" resistors 292 and 294 are of the same general order of magnitude as resistors 92 and 94, respectively, so they have no significant effect on the propagation of RF signal through the RF signal paths of the switch 310. However, the presence of resistors 292 and 294 has an effect on the biasing of the FETs 32, 42.

Figures 3B, 3C:
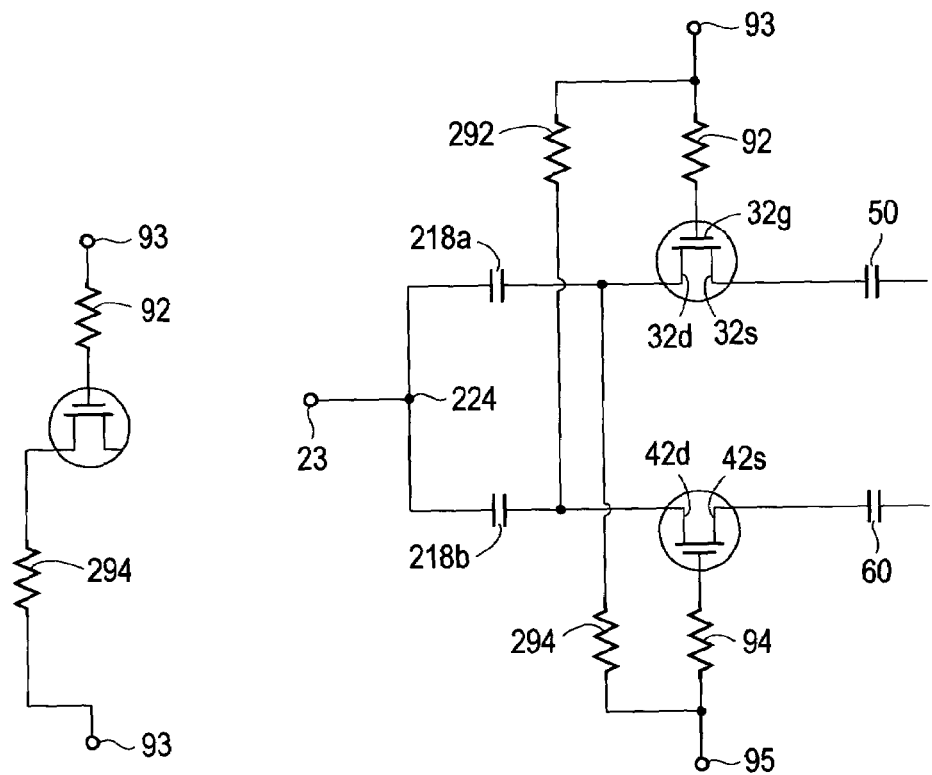
FIG. 3b is a simplified schematic diagram illustrating the biasing arrangement of the switch of FIG. 3a, FIG. 3c represents a portion of the schematic illustration of the biasing arrangement of FIG. 3b.

FIG. 3b is a simplified schematic diagram illustrating the biasing arrangement as it exists in the switch 310 of FIG. 3a. In FIG. 3b, the presence of capacitors 218a and 218b prevents connection between the drain electrodes 32d, 42d of FETs 32 and 42, respectively, for purposes of control bias. Examination of the bias available to the gate-to-path of FET 32 shows that its gate electrode 32g is connected by way of resistor 92 to bias terminal 93, and its drain electrode 32d is connected by way of resistor 294 to the other bias terminal 95. This biasing arrangement is illustrated in FIG. 3c. Since the resistors are deemed to be irrelevant to the biasing of a FET in which the gate-to-path junction is reverse-biased, the gate 32g may be considered to be connected directly to bias voltage terminal 93 and the drain 32d to be connected directly to bias voltage terminal 95. Consequently, the bias voltage available for application to the gate-to-path of transistor 32 is the full voltage of the supply, not reduced by any division with another FET or by subtraction of a Vgs. By symmetry, the voltage available to FET 42 is similarly the full bias supply voltage.

In the case in which one of the FETs 32, 42 is a junction FET with a forward-biased junction, the junction voltage will again be 1 Vgs, and the current will be limited by the two resistors in the biasing current path. If it is transistor 42 which is forward biased, for example, the voltage between its gate 42g and drain 42d will be approximately Vgd, and the remainder of the full bias voltage will appear or "be dropped" across series-connected resistors 94 and 292.

Figure 4:
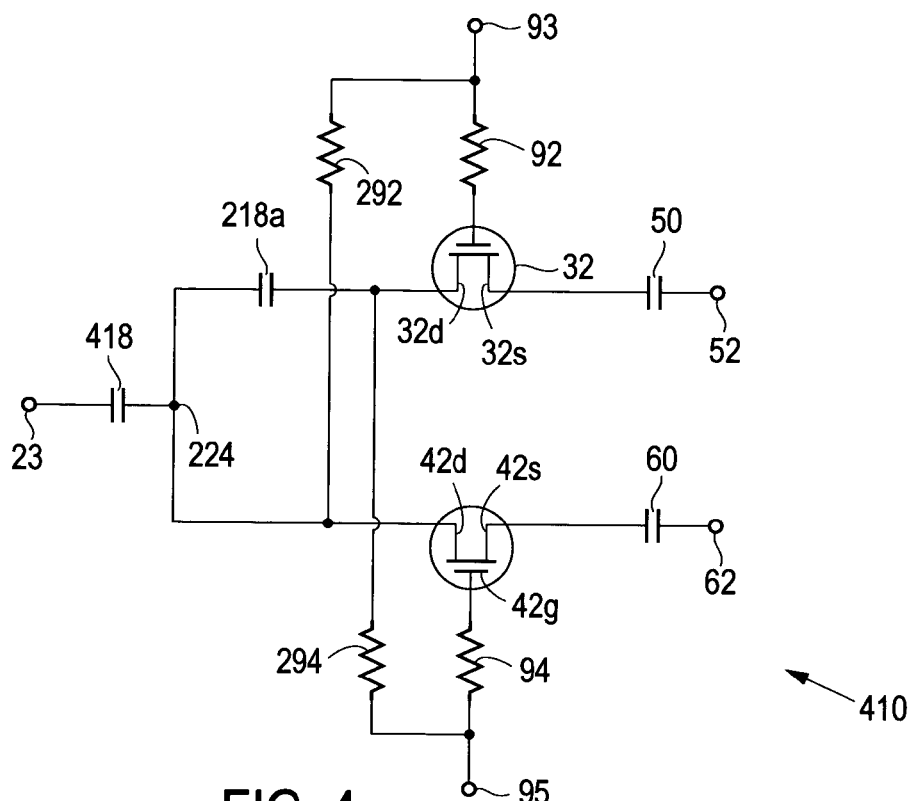

It should be noted that in FIG. 3a or 3b, only one of capacitors 218a and 218b is needed in principle in order to isolate the drains 32d, 42d of FETs 32, 42, respectively, from each other, so long as the RF source (not illustrated) has a high impedance to direct voltage. Most RF sources, however, have relatively low direct-current impedance or resistance, unless they incorporate a separate capacitor. The arrangement of FIG. 4 illustrates a rearrangement of capacitors on the common side of an RF SPDT switch 410. Elements of FIG. 4 corresponding to those of FIG. 3a or 3b are designated by like reference numerals. In FIG. 4, capacitor 218a occupies the same location as in FIG. 3a or 3b, namely between node 224 and the drain 32d of FET 32. Capacitor 418 is substituted for capacitor 218b, and relocated to lie between node 224 and input node 23. In the arrangement of FIG. 4, the capacitors 218a and 418 may be ignored for purposes of RF signal flow, so the RF signal is coupled from node 23 equally to drains 32d, 42d, as in the arrangement of FIG. 3a. Direct-current isolation between the drains 32d and 42d of FETs 32 and 42, and between them and the RF source (not illustrated) which may be connected to port or node 23, is provided by capacitors 218a and 418. More particularly, capacitor 218a isolates drain 32d from drain 42g, and capacitor 418 isolates drain 42d from port or node 23. By symmetry, capacitor 218a of FIG. 4 could be replaced by a conductor, and a further capacitor 218b could be placed in the path between capacitor 418 and the drain 42d of FET 42, with equivalent performance.

As the need arises to design a switch requiring minimum control voltages, the power handling of the switch is challenged only by the pinchoff limited power handling of the OFF transistors. In the present invention, a transistor switch is utilized which eliminates the voltage drop $V_d$ across the ON transistors, thus altering the equations for determining the input power at which the transistor switch will begin to distort the input signal. For example, the input power at which the transistor switch will begin to distort the input signal where the OFF transistors are pinchoff limited becomes:

$$P_{PL}=10 \log_{10}\{125/R_s[2*N(V_{po}+V_{CTRL})(N*R_{on}+R_S+R_L/(N*R_{on}+R_L)]^2\}$$

It will be noted that the above equation differs significantly from the prior art device equations for $P_{inl(PL)}$ because additional DC blocking capacitors 218a, 218b are added at the input port 23, thus allowing the independent biasing of the gates of the ON transistors 32 and the OFF transistors 42, and eliminating the diode drop voltage component ($V_d$) from the equation.

Figure 5:
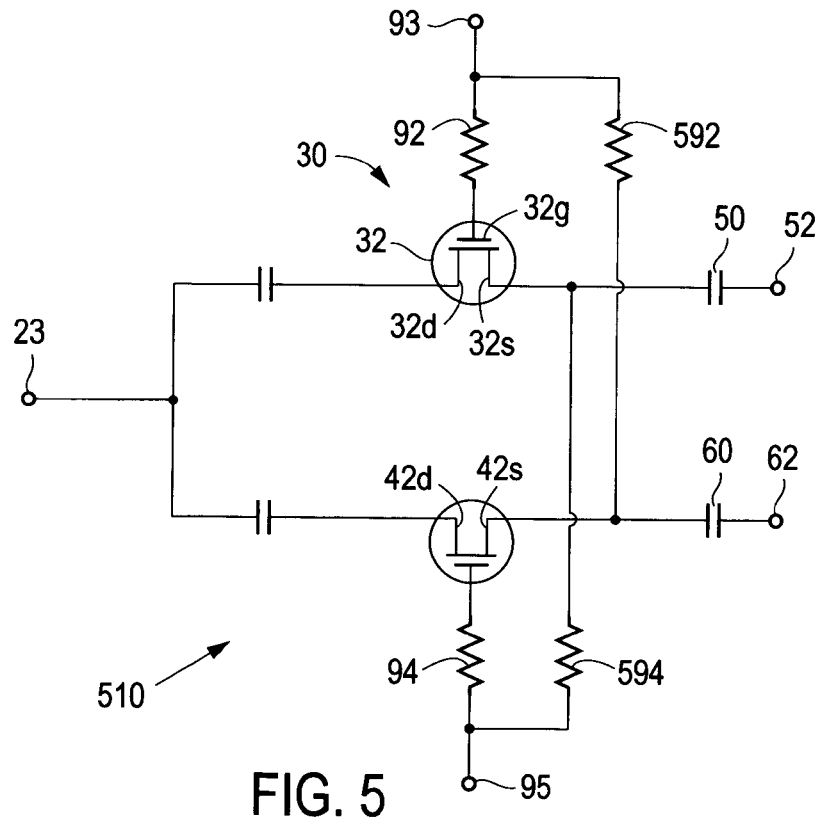
FIG. 5 illustrates an RF switch according to an alternative embodiment of the present invention.

FIG. 4 is a simplified diagram in block and schematic form of an alternative arrangement according to an aspect of the invention, in which the connections of the "cross coupling" resistors are made to the sources 32s, 42s of FETs 32 and 42, respectively, rather than to their drains. As mentioned, the signal paths 32p and 42p which extend from the sources 32s, 42s to the drains 32d, 42d of FETs 32, 42, respectively, may be considered to be resistors of relatively low nominal value, even in the OFF state of the corresponding FET. Consequently, so long as the resistance of the RF signal path is small, it is irrelevant whether the bias voltage is applied to the drain or to the gate, as the gate-to-path bias voltage will be about the same in both situations. FIG. 5 illustrates an RF SPDT switch 510 similar to switch 310 of FIG. 3a. Corresponding elements are designated by like reference numerals. FIG. 5 differs from FIG. 3a only in that the "cross coupling" resistors are designated 592 and 594, and in that they are coupled from control or bias voltage terminals 93 and 95, respectively, to the sources 32s and 42s, respectively. The arrangement of FIG. 5 will perform generally in the same manner as the arrangements of FIGS. 3a and 4.

Figure 6:
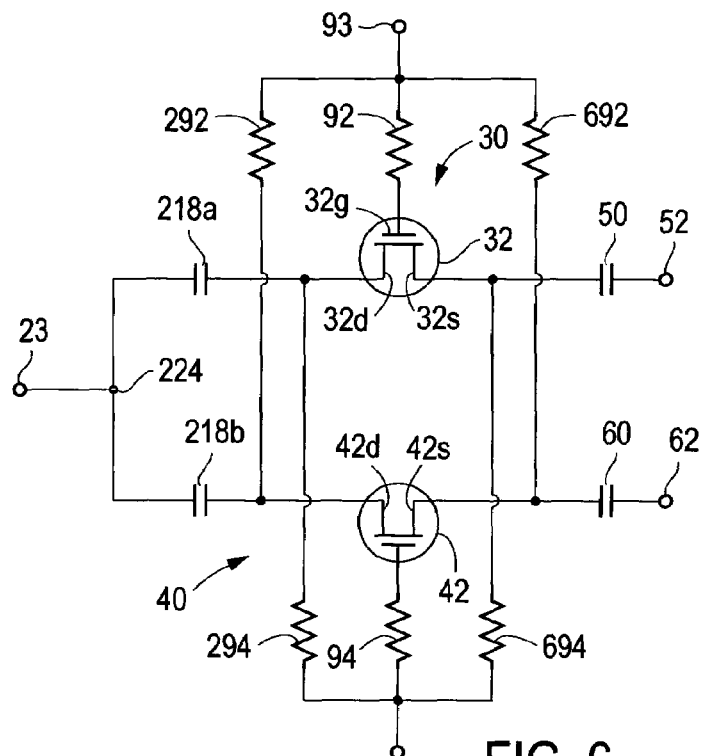
FIG. 6 illustrates an RF switch according to another alternative embodiment of the present invention.

Instead of using a single "cross coupling" resistor for each bias connection, it is possible to use two or more connections. FIG. 6 is similar to FIG. 3a, with the exception of additional "cross coupling" resistors 692 and 694. Resistor 692 is connected between bias or control voltage terminal 93 and that end of the RF conductive path 42p of FET 42 which is remote from that end of the path connected to resistor 292. For the described electrode connections of the FET 42, the end of resistor 692 remote from terminal 93 is connected to the source 42s of FET 42. Resistor 694 is connected between bias or control voltage terminal 95 and that end of the RF conductive path 32p of FET 32 which is remote from that end of the path which is connected to resistor 294. For the described electrode connections of the FET 32, the end of resistor 694 remote from terminal 95 is connected to the source 32s of FET 32. Such an arrangement will tend to provide more symmetrical bias of the gate-to-path junction in the presence of path resistance.

Figure 7:
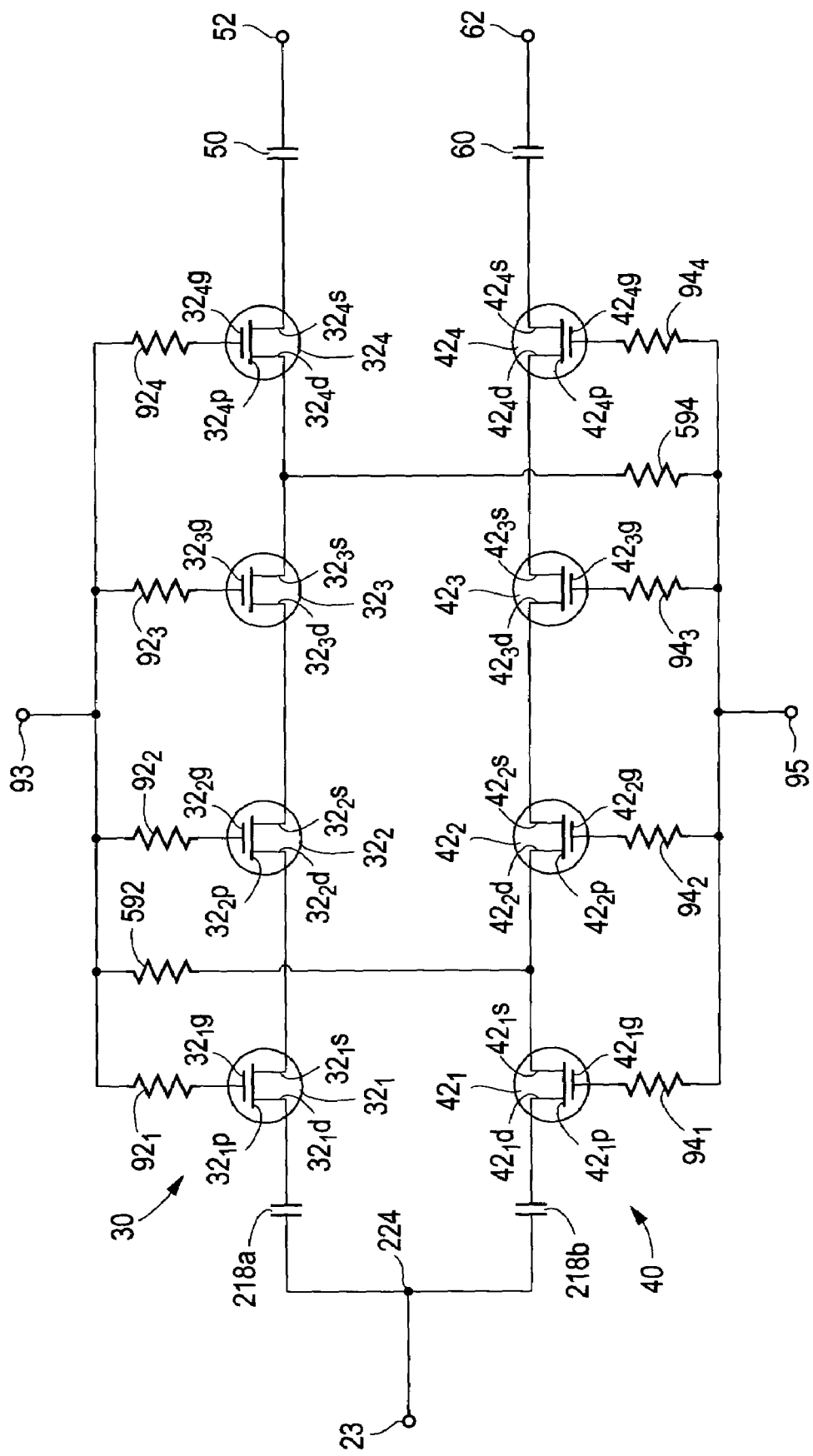
FIG. 7 illustrates an RF switch according to an aspect of the invention in which the interior FETs of a cascade are arranged in such an order.

As described in conjunction with the prior art of FIG. 1a, each field-effect transistor arrangement 30 and 40 may include a single FET transistor, such as 32 and 42, respectively. Alternatively, as described in conjunction with the prior art of FIG. 2, each field-effect transistor arrangement 30 and 40 may be made up of a cascade of plural FETs, such as $32_1$, $32_2$, $32_3$, and $42_1$, $42_2$, $42_3$, respectively. In the cascade, the RF paths are connected end-to-end. This may be accomplished by connecting the drain of a FET in the interior of the cascade to the source of the next in line, and its source to the drain of the previous in line. However, it can be accomplished by connecting sources and drains in any order, if desired. FIG. 7 illustrates an RF SPDT switch according to an aspect of the invention in which the interior FETs of a cascade are arranged in such an order. In FIG. 7, FET arrangement 30 includes a cascade of FETs includes FETs $32_1$, $32_2$, $32_3$, and $32_4$, and cascade 30 of FETs includes FETs $42_1$, $42_2$, $42_3$, and $42_4$. The source $32_1s$ of FET $32_1$ is connected to the source $32_2s$ of FET $32_2$, the drain $32_2d$ of FET $32_2$ is connected to the drain $32_3d$ of FET $32_3$, and the source $32_3s$ of FET $32_3$ is connected to the source $32_4s$ of FET $32_4$. While the connections of FET transistor arrangement 40 could mirror or be symmetrical to the connections of arrangement 30, they may be different. In FIG. 7, arrangement 40 of FETs includes a cascade of FETs $42_1$, $42_2$, $42_3$, and $42_4$. The drain $42_1d$ of FET $42_1$ is connected to the source $42_2s$ of FET $42_2$, the drain $42_2d$ of FET $42_2$ is connected to the drain $42_2d$ of FET $42_3$, and the source $42_3s$ of FET $42_3$ is connected to the source $42_4s$ of FET $42_4$.

Also in FIG. 7, the "cross coupling" resistors are shown as being connected at locations lying between interior FETs in a cascade. More particularly, "cross-coupling" resistor 592 is connected at one end to control or bias voltage source terminal 93, and at the other end to the junction of the drain $42_1d$ of transistor $42_1$ with the source $42_2s$ of transistor $42_2$. Similarly, the one end of cross-coupling resistor 594 is connected to bias or control voltage source terminal 95 and at the other end to the junction between the source $32_3s$ of FET $32_3$ and the source $32_4s$ of FET $32_4$. More than two such "cross coupling" resistors can be used, and in fact such a resistor may be connected to the non-cascaded end of end FETs of the cascade, and to each interior junction of the cascade, if desired.

U.S. Pat. No. 6,426,525, issued Jul. 30, 2002 in the name of Brindle, describes the use of harmonic reduction capacitors in conjunction with FETs, for improved harmonic noise rejection. Any of the arrangements according to the invention may include harmonic rejection capacitors such as those of the Brindle patent.

Figure 8:
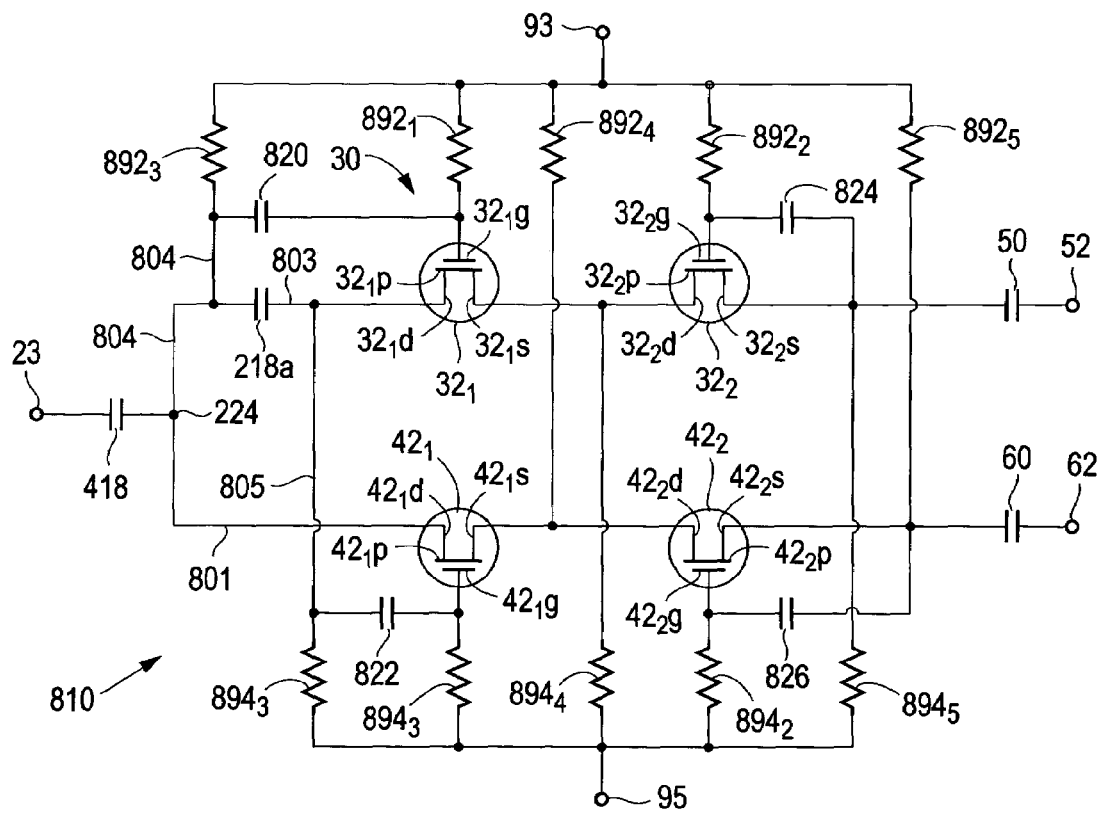
FIG. 8 illustrates an arrangement according to another alternative embodiment of the present invention.

FIG. 8 illustrates an arrangement according to an aspect of the invention in which harmonic suppression capacitors are used. In FIG. 8, the common RF port is 23. The RF is coupled to the drain $42_1d$ of a FET $42_1$ by way of dc blocking capacitor 418 and node 224. Similarly, the RF is coupled to the drain $32_1d$ of a FET $32_1$ by way of dc blocking capacitor 418, node 224, and further de blocking capacitor 218a. The path $32_1p$ of transistor $32_1$ is cascaded with the path $32_2p$ of transistor $32_2$ by connecting the source $32_1s$ of transistor $32_1$ to the drain $32_2d$ of transistor $32_2$. The path $42_1p$ of transistor $42_1$ is cascaded with the path $42_2p$ of transistor $42_2$ by connecting the source $42_1s$ of transistor $42_1$ to the drain $42_2d$ of transistor $42_2$. The sources $32_2s$ and $42_2s$ of FETs $32_2$ and $42_2$ are connected by way of capacitors 50 and 60, respectively, to individual ports 52 and 62. Bias voltage is coupled from terminal 93 to the gates $32_1g$ and $32_2g$ of FETs $32_1$ and $32_2$, respectively, by resistors $892_1$ and $892_2$, respectively. Bias voltage is cross coupled from terminal 93 to the drain $42_1d$ of FET $42_1$ by a resistor $892_3$, to the junction of the source $42_1s$ of FET $42_1$ with the drain $42_2d$ of transistor $42_2$ by a resistor $892_4$, and to the source $432_2s$ of transistor $432_2$ by a resistor $892_5$. Bias voltage is coupled from terminal 95 to the gates $42_1g$ and $42_2g$ of FETs $42_1$ and $42_2$, respectively, by resistors $894_1$ and $894_2$, respectively. Bias voltage is cross coupled from terminal 95 to the drain $32_1d$ of FET $32_1$ by a resistor $894_3$, to the junction of the source $32_1s$ of FET $32_1$ with the drain $32_2d$ of transistor $32_2$ by a resistor $894_4$, and to the source $32_2s$ of transistor $32_2$ by a resistor $894_5$. It should be noted that, for purposes of RF, port or node 23, node 224, conductors 801, 802, 803, 804, and 805 are, in principle, at the same potential. Those skilled in the art will recognize that the potential may differ due to practical factors such as the electrical lengths of the conductors and their impedances. Assuming that the same potential exists throughout nodes 23 and 224, and conductors 801, 802, 803, 804, and 805 harmonic suppression may be provided by additional RF coupling capacitors 820 connected between conductor 804 and the gate $32_1g$ of FET $32_1$ and capacitor 822 connected between conductor 805 and the gate $42_1g$ of FET $42_1$. Similarly, harmonic suppression may be provided by additional RF coupling capacitors 824 connected between the gate $32_2g$ and source $32_2s$ of transistor $32_2$ and 826 connected between the gate $42_2g$ and source $42_2s$ of FET $42_2$.

Figure 9A:
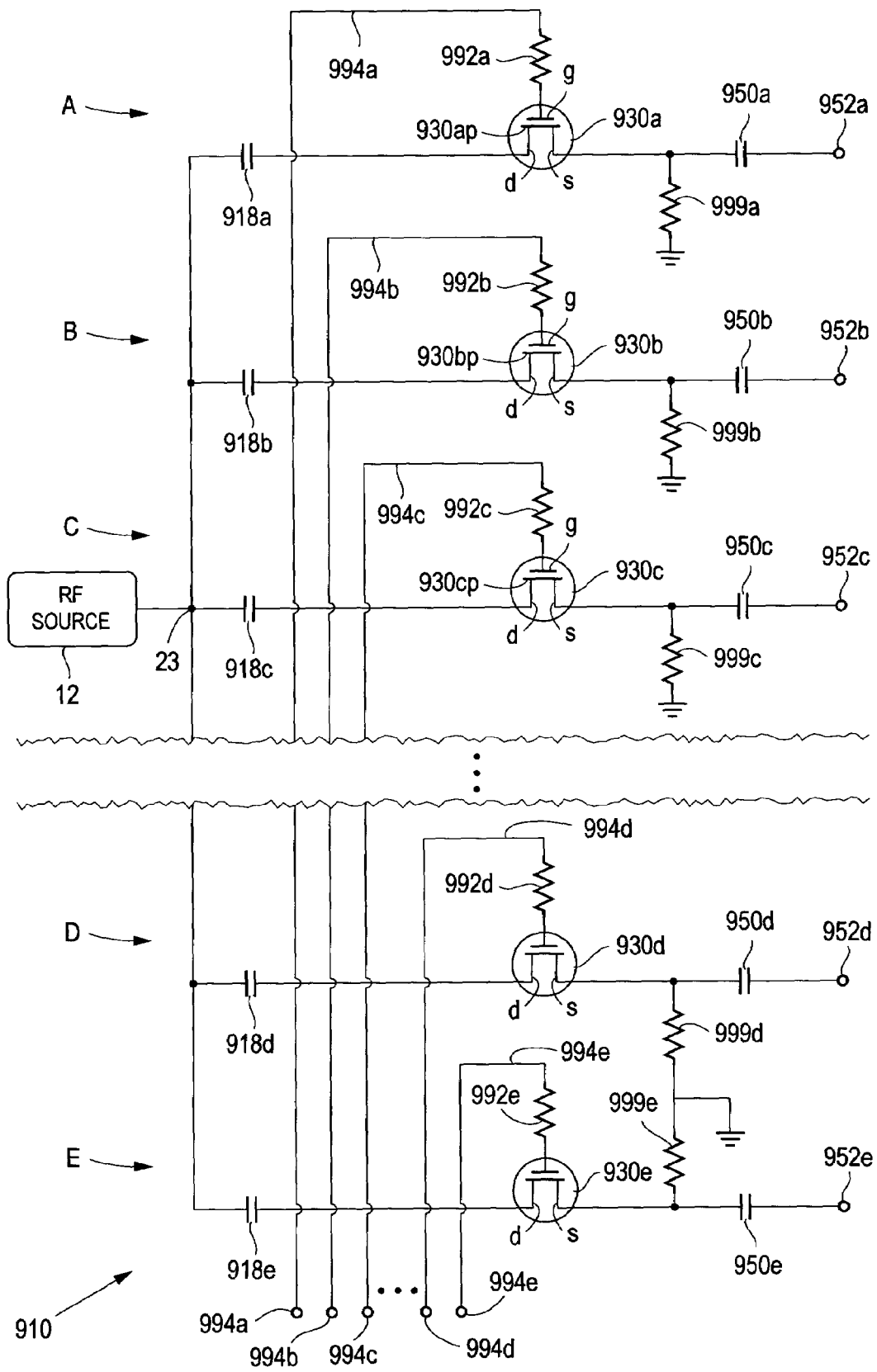
FIGS. 9a and 9b illustrate switch arrangements according to another alternative embodiment of the present invention.
Figure 9B:
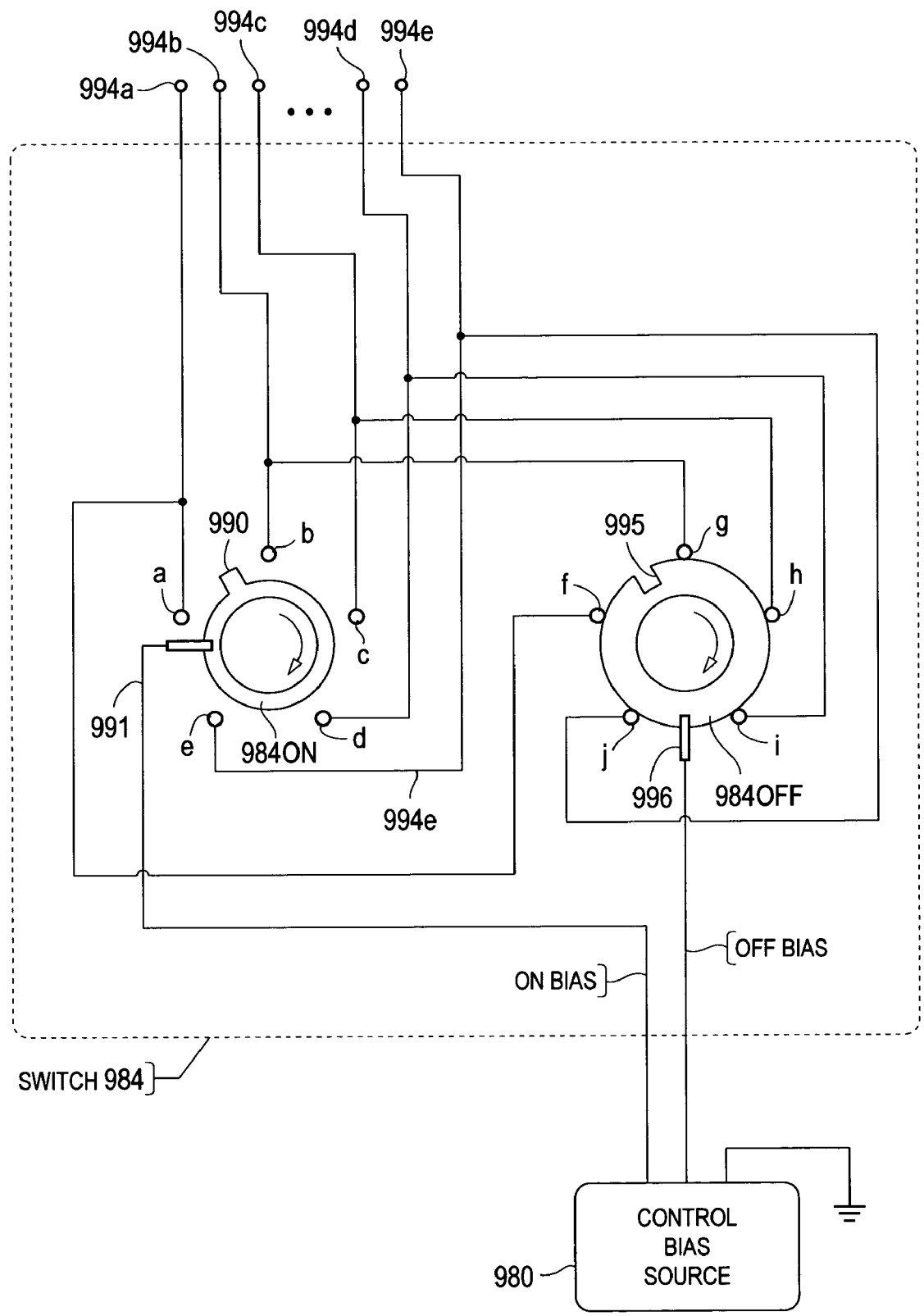

FIGS. 9a and 9b, referred to together as "FIG. 9", is a simplified diagram in block and schematic form of a single-pole, multiple-throw RF switch 910. In FIG. 9, an RF source 12 is assumed to be coupled to common port 23 (always remembering that a load can be connected to the common port 23, and RF source(s) to one or more of the individual ports). In the arrangement of FIG. 9, a plurality of controlled single-pole, single-throw RF switches designated generally as A, B, C, . . . D, E extend from common port 23 to individual ports 952a, 952b, 952c, . . . , 952d, 952e, respectively. Each single-pole, single-throw RF switch A, B, C, . . . D, E includes a controllable FET including source (s), drain (d), and gate (g) electrodes, and a controllable path p for the flow of RF signal between the common port 23 and one of the individual ports. More particularly, switch A includes the series combination of a dc blocking capacitor 918a, the drain-to-source conductive path 930ap of a FET 930a, and a further dc blocking capacitor 950a extending between common port 23 and individual port 952a. Switch B includes the series combination of a dc blocking capacitor 918b, the drain-to-source conductive path 930bp of a FET 930b, and a further dc blocking capacitor 950b extending between common port 23 and individual port 952b. Switch C includes the series combination of a dc blocking capacitor 918c, the drain-to-source conductive path 930cp of a FET 930c, and a further dc blocking capacitor 950c extending between common port 23 and individual port 952c. Switch D includes the series combination of a dc blocking capacitor 918d, the drain-to-source conductive path 930dp of a FET 930d, and a further dc blocking capacitor 950d extending between common port 23 and individual port 952d, and switch E includes the series combination of a dc blocking capacitor 918e, the drain-to-source conductive path 930ep of a FET 930e, and a further dc blocking capacitor 950e extending between common port 23 and individual port 952e. Any number of such single-pole, single throw switches may be connected between common port 23 and additional individual ports (not illustrated).

In the arrangement of switch 910 of FIG. 9, each FET is biased by a control voltage or bias applied between its gate electrode or terminal and the conductive path. In the particular embodiment of FIG. 9, the conductive path is connected, for purposes of biasing, to a reference potential denoted by a conventional ground symbol. More particularly, the sources of FETs 930a, 930b, 930c, . . . , 930d, 930e are connected to ground by way of a resistor having a value which is high relative to the characteristic impedance of the RF transmission path, for reducing RF losses, and which is small relative to the gate-to-source impedance, for coupling most of the bias voltage to the gate-to-path junction. Specifically, the source s of FET 930a is connected to ground by a resistor 999a, the source s of FET 930b is connected to ground by a resistor 999b, the source s of FET 930c is connected to ground by a resistor 999c, . . . , the source s of FET 930d is connected to ground by a resistor 999d, and the source s of FET 930e is connected to ground by a resistor 999e. A reasonable value for each of the resistors 999 would be in the range around 1 to 10 kilohms (K). An ON bias voltage is applied to the gate of that one (or more than one, if desired) FET which is to be made conductive for RF, and an OFF bias voltage is applied to that one (or many) of the FETs which are to be OFF. For a single-pole, multiple-throw RF switch (five throws illustrated in FIG. 9), one FET is biased ON and all the other FETs are biased OFF.

The bias for control of the switch of FIG. 9a is applied over a conductor and through a resistor to the gate of each FET. More particularly, bias for the gate of FET 930a is provided by way of a conductive path 994a and a gate resistor 992a. Similarly, bias for the gate of FET 930b is provided by way of a conductive path 994b and a gate resistor 992b, bias for the gate of FET 930c is provided by way of a conductive path 994c and a gate resistor 992c, . . . , bias for the gate of FET 930d is provided by way of a conductive path 994d and a gate resistor 992d, and bias for the gate of FET 930e is provided by way of a conductive path 994e and a gate resistor 992e. As mentioned, one of the biases will ordinarily be an ON bias and the remainder of the biases OFF biases.

Digital or electronic control of the bias voltages is well known to those skilled in the art, but explanations are ordinarily couched in terms of ordinary mechanical switches. FIG. 9b illustrates a simplified mechanical switch equivalent which is useful for explaining the bias voltage generation for application to conductors 994a through 994e. In FIG. 9b, first and second ganged rotary switch conductive sections 984ON and 984OFF rotate together. Rotary conductive section 984ON has a protruding tab 990, and conductive section 984OFF has a recessed section 995 indexed to the same rotational position as tab 990. Rotary switch section 984ON has five associated fixed switch contacts designated a, b, c, . . . , d, and e, and rotary switch section 984OFF has corresponding fixed switch contacts f, g, h, . . . , i, j, where contacts a and f are at the same rotational position, contacts b and g are at the same rotational position, and contact pairs c and h, d and i, and e and j are at the same rotational positions. Rotary switch section 984ON makes contact with only one of its fixed contacts at a time, namely that one of the contacts on which tab 990 falls. Rotary switch section 984OFF makes contact with all its associated fixed contacts except that one on which notch 995 falls.

A control bias source designated 980 in FIG. 9 generates ON bias relative to reference potential and applies it to a contact element 991, which makes contact with rotary switch section 984ON at all times, so that ON bias is always available at tab 990, and on that one of the switch contacts a, b, c, d, or e on which the tab falls. Control bias source 980 also generates an OFF bias relative to reference, and applies the OFF bias by way of a contact element 996 to rotary section 984OFF. Thus, all switch contacts f, g, h, i, and j associated with rotary switch section 984OFF receive OFF bias, except that one on which notch 995 falls. ON switch terminal a is connected by a conductive path to OFF switch terminal f and to conductive path 994a, ON switch terminal b is connected by a conductive path to OFF switch terminal g and to conductive path 994b, ON switch terminal c is connected by a conductive path to OFF switch terminal h and to conductive path 994c, . . . , ON switch terminal d is connected by a conductive path to OFF switch terminal i and to conductive path 994d, and ON switch terminal e is connected by a conductive path to OFF switch terminal j and to conductive path 994e. At any rotational position of switch 984, one of the conductors 994a, 994b, 994c, . . . , 994d, or 994e is connected by way of tab 990 and the rotational section 984ON to the ON bias, and the remaining ones of conductors 994a, 994b, 994c, . . . , 994d, and 994e are connected by way of switch section 984OFF and conductive element 996 to receive OFF bias. Thus, as the ganged sections 984ON and 984OFF of switch 984 rotate relative to their fixed contacts, the tab and notch coact to apply ON bias to a selected one of the bias conductors for FETs 930a, 930b, 930c, . . . , 930d, or 930e, and OFF bias to the remaining ones of the FETs. Consequently, one, and only one of the FETs of FIG. 9 is turned ON, and the remainder are OFF.

Other embodiments of the invention will be apparent to those skilled in the art. For example, it is understood that multiple throw switches are also contemplated in the application, with control voltages applied to the switch as logical opposites.

Thus, a switch (10) according to an aspect of the invention is for switching radio-frequency electromagnetic signal between a common port (23) and first (52) and second (62) individual ports. The switch (10) comprises a first FET arrangement (30) including a signal path ($32p$: $32_1p$, $32_4p$) extending from a source terminal ($32s$) to a drain terminal ($32d$: $32_4d$), and also including a gate terminal ($32g$). The conduction of the signal path ($32p$: $32_1p$, $32_4p$) of the first FET arrangement (30) is under control of a gate-to-path control voltage applied thereto. A second FET arrangement (40) includes a signal path ($42p$:$42_1p$,$42_4p$) extending from a source terminal ($42s$: $42_4s$) to a drain terminal ($42d$), and also includes a gate terminal ($42g$). The conduction of the signal path ($42p$:$42_1p$,$42_4p$) of the second FET arrangement (40) is under control of a gate-to-path control voltage applied thereto. Connection means (218a, 218b: 218a, 418) are coupled to the common port (23), to a first terminal (one of source and drain) of the signal path ($32p$: $32_1p$, $32_4p$) of the first FET arrangement (30), and to a first terminal (one of source and drain) of the signal path ($42p$) of the second FET arrangement (40), for coupling alternating current (AC or ac), but not direct current (DC or dc), between the common port (23) and the first terminals of the signal paths of the first (30) and second (40) FET arrangements. First further connection means (50) are coupled to the second terminal (the other one of source and drain) of the signal path ($32p$: $32_1p$, $32_4p$) of the first FET arrangement (30) and to the first individual port (52), for coupling alternating signal between the second signal terminal (the other one of the source and drain) of the first FET arrangement (30) and the first individual port (52). Second further connection means (60) are coupled to the second terminal (other one of the source and drain) of the signal path ($42p$:$42_1p$,$42_4p$) of the second FET arrangement (40) and to the second individual port (60), for coupling alternating signal between the second signal terminal (other one of the source and drain) of the second FET arrangement (40) and the second individual port (62). At least one controllable source of control voltage (80, 93, 95; 980, 984) is provided. The controllable source of control voltage (80, 93, 95; 980, 984) is coupled to the first (30) and second (40) FET arrangements to bias the first FET arrangement (30) for conduction when the second FET arrangement (40) is biased for nonconduction, and to bias the second FET arrangement (40) for conduction when the first FET arrangement (30) is biased for nonconduction.

In a particular embodiment of the switch (10) according to an aspect of the invention, the at least one controllable source of the control voltage (80, 93, 95) defines first (terminal 93 positive: ON) and second (terminal 94 positive: OFF) control voltage terminals at which control voltage is produced. The controllable source (80, 93, 95) further comprises first conductive means (92: $892_1$) coupled to the first control voltage terminal (93; 93) of the controllable source (80, 93, 95) and to the gate electrode ($32g$) of the first FET arrangement (30), and second conductive means (292: 592: $892_4$) coupled to the first control voltage terminal (93: 93) of the controllable source and to one of the first ($42d$) and second ($43s$) electrodes of the second FET arrangement (40). In addition, third conductive means (94: $894_1$) are coupled to the second control voltage terminal (95) of the controllable source (80, 93, 95) and to the gate electrode ($42g$) of the second FET arrangement (40), and fourth conductive means (294: 594: $894_4$) are coupled to the second control voltage terminal (95) of the controllable source (80, 93, 95) and to one of the first ($32d$) and second ($32s$) electrodes of the first FET arrangement (30). In particularly advantageous embodiments, at least one of the first FET arrangement (30) and the second FET arrangement (40) is a composite FET including plural cascaded FET sections ($32_1$, $32_2$: $42_1$, $42_2$).

What is claimed is:

1. A switch for switching radio-frequency electromagnetic signal between a common port and first and second individual ports, said switch comprising:

a first FET arrangement including a signal path extending from a source terminal to a drain terminal, and also including a gate terminal, the conduction of said signal path being under control of a gate-to-path control voltage;

a second FET arrangement including a signal path extending from a source terminal to a drain terminal, and also including a gate terminal, the conduction of said signal path being under control of a gate-to-path control voltage;

means coupled to said common port, to a first terminal of said signal path of said first FET arrangement, and to a first terminal of said signal path of said second FET arrangement, for coupling alternating current between said common port and said first terminals of said signal paths of said first and second FET arrangements, but for not coupling direct current between said first terminals of said first and second FET arrangements;

means coupled to a second terminal of said signal path of said first FET arrangement and to said first individual port, for coupling alternating signal between said second signal terminal of said first FET arrangement and said first individual port;

means coupled to said second terminal of said signal path of said second FET arrangement and to said second individual port, for coupling alternating signal between said second signal terminal of said second FET arrangement and said second individual port; and at least one controllable source of said control voltage defining first and second control voltage terminals at which control voltage is produced, said controllable source being coupled to said first and second FET arrangements to bias said first FET arrangement for conduction when said second FET arrangement is biased for nonconduction, and to bias said second FET arrangement for conduction when said first FET arrangement is biased for nonconduction, said at least one controllable source comprising:

first conductive means coupled to said first control voltage terminal of said controllable source and to said gate terminal of said first FET arrangement;

second conductive means coupled to said first control voltage terminal of said controllable source and to one of said source and drain terminals of said second FET arrangement;

third conductive means coupled to said second control voltage terminal of said controllable source and to said gate terminal of said second FET arrangement; and fourth conductive means coupled to said second control voltage terminal of said controllable source and to one of said source and drain terminals of said first FET arrangement.

2. The switch according to claim 1, wherein at least one of said first FET arrangement and said second FET arrangement is a composite FET including plural cascaded FET sections.

3. The switch according to claim 1, wherein the switch comprises a multiple throw switch arrangement.

4. The switch according to claim 1, wherein the first FET arrangement comprises a plurality of JFETs.

5. The switch according to claim 4, wherein the second FET arrangement comprises a plurality of JFETs.

6. A semiconductor switch comprising:

an input port;

at least first and second output ports; a first set of transistors having gate, source and drain terminals and coupled to the first output port at the source terminal;

a second set of transistors having gate, source and drain terminals and coupled to the second output port at the source terminal;

a first capacitor coupled between the input port and the drain terminal associated with the first set of transistors, and a second capacitor coupled between the input port and the drain terminal associated with the second set of transistors;

a first resistor coupled between the source terminal associated with the first set of transistors and a first terminal associated with a controllable voltage signal, and a second resistor coupled between the source terminal associated with the second set of transistors and a second terminal associated with a controllable voltage signal; and a controllable source for alternately biasing the first and second sets of transistors between ON and OFF states, wherein the first resistor cooperates with the first and second capacitors to provide a DC path bypassing the gate-drain terminal voltage drop associated with the first set of transistors when said first set is biased in the ON state, and wherein the second resistor cooperates with the first and second capacitors to provide a DC path bypassing the gate-drain terminal voltage drop associated with the second set of transistors when said second set is biased in the ON state.

7. The switch according to claim 6, wherein the input power value at which the switch will begin to distort an input signal is determined by the following equation:

$$P_{PL}=10\ \log_{10}\{125/R_S[2*N(V_{po}+V_{CTRL})(N*R_{on}+R_S+R_L/(N*R_{on}+R_L)]^2\},$$

where $V_{po}$ is the pinchoff voltage of the first set of transistors, $V_{CTRL}$ is the control voltage applied to the gates of the second set of transistors, $R_{on}$ is the combined "ON" resistance of the second set of transistors, $R_s$ is the voltage source resistance, $R_L$ is the load resistance, and N is the number of transistors in each of the first and second sets of transistors.

8. The switch according to claim 6, wherein a resistor network is coupled between the gate terminal of first set of transistors and a control terminal receiving the bias voltage.

9. The switch according to claim 6, wherein a resistor network is coupled between the gate terminal of second set of transistors and a control terminal receiving the bias voltage.

10. A method for controlling a transistor switch comprising at least a first transistor arrangement including a signal path extending from a source terminal to a drain terminal, and also including a gate terminal, the conduction of the signal path being under control of a gate-to-path control voltage, and a second transistor arrangement including a signal path extending from a source terminal to a drain terminal, and also including a gate terminal, the conduction of the signal path being under control of a gate-to-path control voltage, the method comprising:

providing a first capacitor between the input port and the drain terminal associated with the first transistor arrangement, and a second capacitor between the input port and the drain terminal associated with the second transistor arrangement;

providing a first resistor between the source terminal associated with the first transistor arrangement and first terminal associated with a controllable voltage signal, and a second resistor between the source terminal associated with the second transistor arrangement and another terminal associated with said controllable voltage signal; and alternately switching ON and OFF each of the first and second transistor arrangements, whereby a DC path is provided bypassing the gate-drain diode of the first transistor arrangement when said arrangement is in the ON condition, and whereby a DC path is provided bypassing the gate-drain diode of the second transistor arrangement when said arrangement is in the ON condition.

11. The method of claim 10, further comprising coupling a resistor network between the gate terminal of first FET arrangement and said first terminal associated with said controllable voltage source.

12. The method of claim 10, further comprising coupling a resistor network between the gate terminal of second FET arrangement and said second terminal associated with said controllable voltage source.

13. The method of claim 10, wherein the wherein the first FET arrangement comprises a plurality of JFETs.

14. The method of claim 10, wherein the second FET arrangement comprises a plurality of JFETs.

* * * * *